(12) United States Patent
Kim et al.

(10) Patent No.: US 6,864,506 B2
(45) Date of Patent: Mar. 8, 2005

(54) SRAM CELL AND METHOD FOR FABRICATING THE SAME

(75) Inventors: Sung Jin Kim, Chungcheongbuk-do (KR); Sung Wook Choi, Chungcheongbuk-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 106 days.

(21) Appl. No.: 10/321,644

(22) Filed: Dec. 18, 2002

(65) Prior Publication Data

US 2003/0203563 A1 Oct. 30, 2003

(30) Foreign Application Priority Data

Apr. 30, 2002 (KR) ..................................... P2002-23704

(51) Int. Cl.[7] ............................................. H01L 29/76
(52) U.S. Cl. ..................... 257/66; 257/903; 257/904; 438/149; 438/151; 438/157; 438/166
(58) Field of Search ..................... 257/66, 903, 904, 257/E21.661, E27.009; 438/149, 151, 157, 166

(56) References Cited

U.S. PATENT DOCUMENTS 5,712,509 A * 1/1998 Harada et al. .............. 257/758

6,229,186 B1 * 5/2001 Ishida ........................ 257/390
6,236,117 B1 * 5/2001 Ishigaki et al. ............. 257/734

OTHER PUBLICATIONS

Perera, Asanga H., et al. IEEE. vol. 23, No. 4, pp. 571–574, 2000.

Sun, S. W. IEEE. pp. 52–55, 1998.

Young, K. K. vol. 23, No. 2, pp. 563–566, 2000.

* cited by examiner

Primary Examiner—Nathan J. Flynn
Assistant Examiner—Scott R. Wilson
(74) Attorney, Agent, or Firm—Birch, Stewart, Kolasch & Birch, LLP

(57) ABSTRACT

SRAM cell and method for fabricating the same, the SRAM cell including a first local interconnection connected between first terminals of the first access transistor, the first load transistor, and the first drive transistor, and gates of the second load transistor, and the second drive transistor electrically, and a second local interconnection connected between first terminals of the second access transistor, the second load transistor, and the second drive transistor, and gates of the first load transistor, and the first drive transistor electrically, thereby reducing an area of the SRAM cell.

21 Claims, 18 Drawing Sheets

SRAM CELL AND METHOD FOR FABRICATING THE SAME

This application claims the benefit of the Korean Application No. P2002-23704 filed on Apr. 30, 2002, which is hereby incorporated by reference.

BACKGROUND OF THE INVENTION

1. Field of the Invention

The present invention relates to a semiconductor device, and more particularly, to an SRAM cell and a method for fabricating the same, which can reduce a cell size.

2. Background of the Related Art

In general, the SRAM (Static Random Access Memory) cell is provided with a flipflop circuit having two access transistors, two drive transistors, and two load transistors. FIG. 1 illustrates an equivalent circuit of a COMS type SRAM cell.

Referring to FIG. 1, the COMS type SRAM cell has first, and second access transistors Q1 and Q2, first and second driver transistors Q3 and Q4, and first, and second load transistors Q5 and Q6.

That is, the SRAM cell is provided with first, and second inverters connected between a power source terminal and a ground terminal in parallel each having a PMOS transistor Q5 or Q6, and an NMOS transistor Q3 or Q4, and a first access transistor Q1 and a second access transistor Q2 each having a source (or a drain) connected to output terminals of the first, and second inverters.

A drain (or source) of the first access transistor Q1 and a drain (or source) of the second access transistor Q2 are connected to a first bitline BL and a second bitline /BL, respectively. Moreover, an input terminal of the first inverter is connected to an output terminal of the second inverter, and an input terminal of the second inverter is connected to an output terminal of the first inverter, to form a latch circuit.

A related art CMOS type SRAM cell will be explained, with reference to the attached drawings. FIG. 2 illustrates a layout of a related art CMOS type SRAM cell, FIG. 3 illustrates a section across a line III—III in FIG. 2, and FIG. 4 illustrates a section across a line II—II in FIG. 2.

Referring to FIGS. 2~4, there is a device isolating film 12 formed in a field region of a semiconductor substrate 11 having the field region and an active region defined thereon, and an n-well region 13 and a p-well region 14 are formed in a surface of the semiconductor substrate 11.

There is a gate electrode 16 formed in an active region over the semiconductor substrate 11 with a gate insulating film 15 inbetween, and there are insulating sidewalls 17 at both sides of the gate electrode 16.

There are source/drain regions 18 in a surface of the semiconductor substrate 11 on both sides of the gate electrode 16, and a metal silicide film 19 on surfaces of the gate electrode 16 and the semiconductor substrate 11 having the source/drain regions 18 formed therein.

There are contact holes so as to expose parts of surfaces of the source/drain regions 18 and the gate electrode 16, and a nitride film 20, a BPSG film 21, and a PE-TEOS film 22 stacked in succession.

There is a tungsten plug 24 inside of the contact hole with a barrier metal film 23 disposed inbetween, and metal interconnections 25 on the tungsten plug 24 and a PE-TEOS film 22 adjacent thereto.

The metal interconnection 25 has a thickness of approx. 5000 Å for local interconnection of a Vcc line, a Vss line, impurity regions of transistors, and the gate electrode.

Thus, since the thickness of the metal interconnection in the related art SRAM cell is greater than 5000 Å, a distance A between the n-well region 13 and the p-well region 14 is 0.70 $\mu$m (0.40/0.30), and the local metal interconnection 25 has a pitch B of 0.45 $\mu$m (L/S=0.22/0.23), to form an area of approx. 4.60 $\mu$m$^2$ in overall.

However, the related art SRAM cell has the following problems.

That is, because an area of the SRAM cell with 6-transistors has 4.60 $\mu$m$^2$ when a 0.18 $\mu$m technology is employed owing to the local metal interconnection and Vcc/Vss lines each having greater than 5000 Å thickness, there has been a limit in reducing a cell size.

SUMMARY OF THE INVENTION

Accordingly, the present invention is directed to an SRAM cell and a method for fabricating the same that substantially obviates one or more of the problems due to limitations and disadvantages of the related art.

An object of the present invention is to provide an SRAM cell and a method for fabricating the same, which can reduce an area of an SRAM cell with 6-transistors when the 0.18 $\mu$m technology is employed.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the SRAM cell having first, and second access transistors, first, and second drive transistors, and first, and second load transistors on the same semiconductor substrate, includes a first local interconnection connected between first terminals of the first access transistor, the first load transistor, and the first drive transistor, and gates of the second load transistor, and the second drive transistor electrically, a second local interconnection connected between first terminals of the second access transistor, the second load transistor, and the second drive transistor, and gates of the first load transistor, and the first drive transistor electrically, an interlayer insulating film formed on an entire surface having contact holes exposing parts of second terminals of the first, and second access transistors, the first, and second load transistors, and first, and second drive transistors, and a metal interconnection connected between second terminals of the first, and second access transistors, first, and second load transistors, and first, and second drive transistors through the contact holes, electrically.

In another aspect of the present invention, there is provided a method for fabricating an SRAM cell, in which first, and second access transistors, first, and second drive transistors, and first, and second load transistors are formed on the same semiconductor substrate, including the steps of forming a first interlayer insulating film on an entire surface of the semiconductor substrate, selectively removing the first interlayer insulating film to form first contact holes to expose parts of first terminals of the second access transistor, the second load transistor, and the second drive transistor, parts of gates of the first load transistor, and the first drive transistor, and parts of second terminals of the first, and second access transistors, first, and second load transistors, and first, and second drive transistors, forming a first conductive plug inside of the first contact hole with a first barrier metal film disposed inbetween, forming a local interconnection on the first conductive plug and the first interlayer insulating film adjacent to the first conductive plug, forming a second interlayer insulating film on an entire surface of the semiconductor substrate inclusive of the local interconnection, selectively removing the second interlayer insulating film to form second contact holes to expose parts of second terminals of the first, and second access transistors, first, and second load transistors, and first, and second drive transistors, forming a second conductive plug inside of the second contact hole with a barrier metal film disposed inbetween, and forming a metal interconnection on the second conductive plugs and the second interlayer insulating film adjacent to the second conductive plug.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and to ether with the description serve to explain the principles of the invention.

In the drawings.

DETAILED DESCRIPTION OF THE PREFERRED EMBODIMENT

Figure 5:
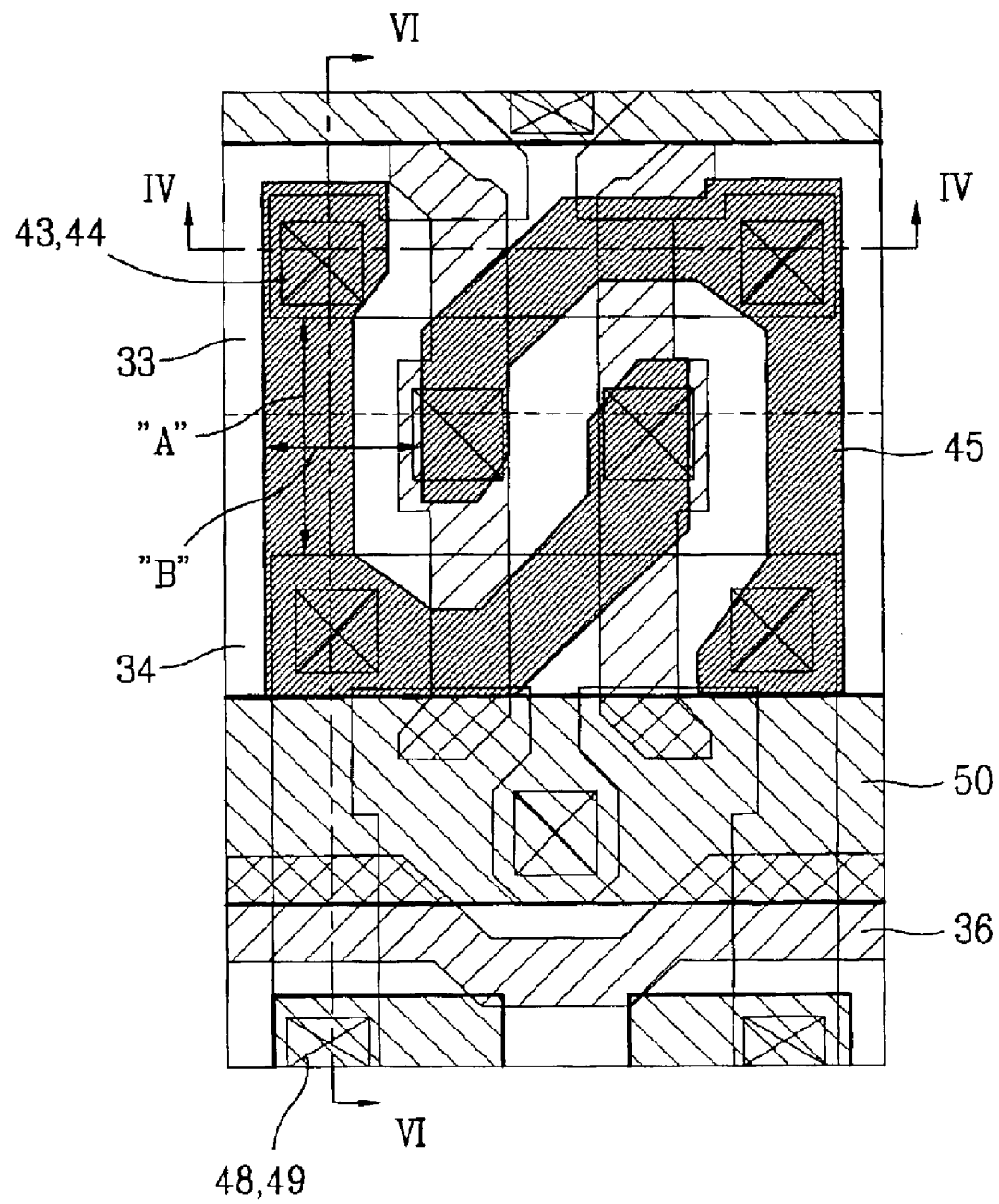
FIG. 5 illustrates a layout of a CMOS type SRAM cell in accordance with a preferred embodiment of the present invention.

Reference will now be made in detail to the preferred embodiments of the present invention, examples of which are illustrated in the accompanying drawings. FIG. 5 illustrates a layout of a CMOS type SRAM cell in accordance with a preferred embodiment of the present invention, FIG. 6 illustrates a section of the SRAM across a line IV—IV in FIG. 5, and FIG. 7 illustrates a section of the SRAM across a line VI—VI in FIG. 5.

Figure 6:
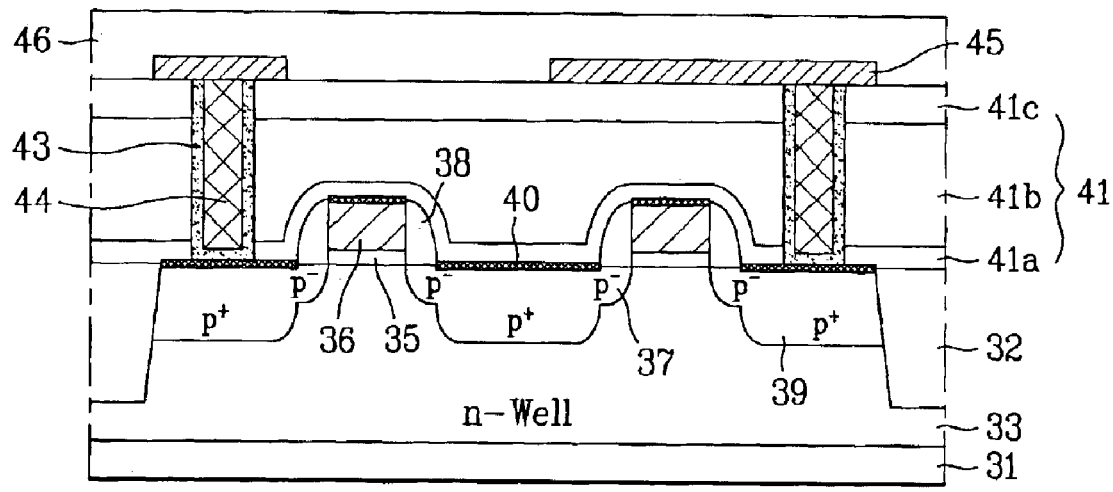
FIG. 6 illustrates a section of the SRAM across a line IV—IV in FIG. 5.
Figure 7:
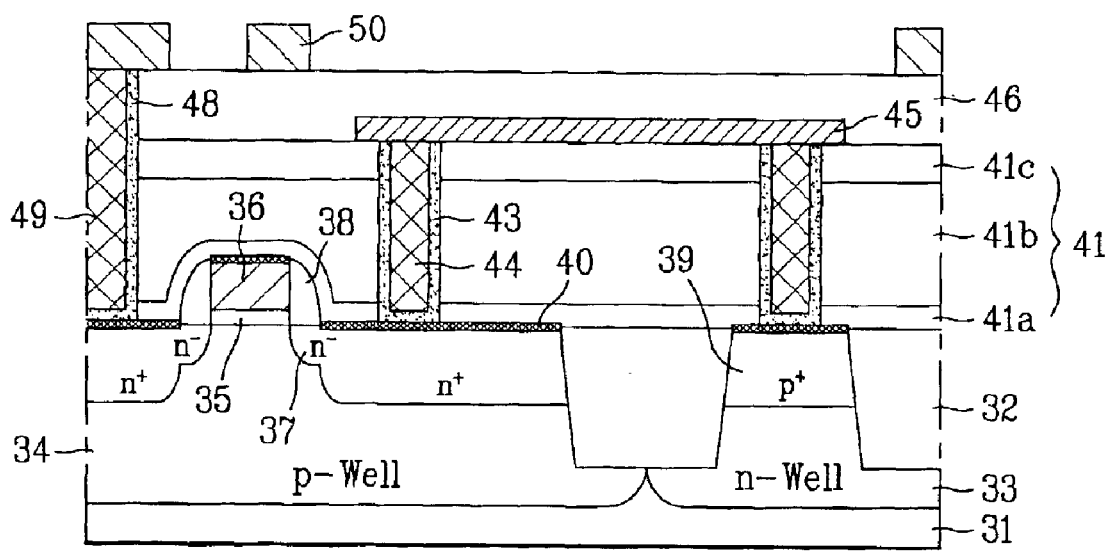
FIG. 7 illustrates a section of the SRAM across a line VI—VI in FIG. 5.

Referring to FIGS. 5~7, there is a device isolating film 32 in a field region of a semiconductor substrate. 31 having a field region, and first, and second active regions defined thereon, and an n-well region 33 and a p-well region 34 are formed in a surface of the semiconductor substrate 31. A region the n-well region 33 formed therein is the first active region, and a region the p-well region 34 formed therein is a second active region. The device isolating film 32 of an STI (Shallow Trench Isolation) structure has a trench depth of approx. 3500 Å from the surface of the semiconductor substrate 31.

There is a gate electrode 36 over the semiconductor substrate 31 with a gate insulating film 35 disposed inbetween, and insulating film sidewalls 38 at both sides of the gate electrode 36. The gate insulating film 35 may have different thickness between a region a PMOS transistor is formed therein, and a region an NMOS transistor is formed therein, with a thin region of being approx. 29 Å thickness and a thick region of being approx. 64 Å thickness. The gate electrode 36 is formed of polysilicon to a thickness of approx. 2500 Å.

There are source/drain regions 39 in a surface of the semiconductor substrate 31 on both sides of the gate electrode 36, and a metal silicide film 40 formed on surfaces of the gate electrode 36 and the semiconductor substrate 31 having the source/drain regions 39 formed therein. The metal silicide film 40 is formed of a refractory metal (for an example, Co/Ti).

There are first contact holes to expose surfaces of the source/drain regions 39 and the gate electrode 36, and a first interlayer insulating film 41. The first interlayer insulating film 41 has a nitride film 41a with approx. 300 Å thickness, a BPSG film 41b with approx. 5500 Å thickness, and a PE-TEOS film 41c with approx. 1000 Å thickness, stacked in succession.

The first contact hole exposes parts of surfaces of source/drain regions of the first load transistor Q5, the first drive transistor Q3, and the first access transistor Q1, and parts of surfaces of gate electrodes of the second load transistor Q6 and the second drive transistor Q4, which are connected in parallel.

The first contact hole also exposes parts of surfaces of source/drain regions of the second load transistor Q6, the second drive transistor Q4, and the second access transistor Q2, and parts of surfaces of gate electrodes of the first load transistor Q5 and the first drive transistor Q3, which are connected in parallel.

There is a first tungsten plug 44 inside of the first contact hole formed to a thickness of approx. 4000 Å, with a first barrier metal film 43 disposed inbetween, and there is a local interconnection metal line 45 formed to a thickness of approx. 300 Å on the first tungsten plug 44 and the first interlayer insulating film 41 adjacent thereto. The local interconnection metal line 45 may be a stack of metal films of low resistances, such as TiN/Ti, with a thickness of the Ti being approx. 200 Å, and a thickness of the TiN of being approx. 100 Å. L/S (Line/Space) of the local interconnection metal line is 0.20/0.19 μm.

There is a second contact hole to expose parts of source/drain regions of the first, and second access transistors Q1 and Q2 and first, and second driver transistors Q1 and Q2, and there is a second interlayer insulating film 46 formed to a thickness of approx. 4000 Å on an entire surface of the semiconductor substrate 31 inclusive of the local interconnection metal line. The second interlayer insulating film 46 is formed of PE-TEOS, and the second contact hole has an approx. 0.23 μm width.

There is a second tungsten plug 49 inside of the second contact hole with a second barrier metal film 48 disposed inbetween, and there are metal lines 50 of Vcc and Vss on the second tungsten plug 49 and the second interlayer insulating film 46 adjacent thereto. The metal line 50 has a stack of Ti/Al/Ti/TiN films formed to thickness of 100/4500/50/600 Å.

In the meantime, in the SRAM cell of the present invention, the related art metal interconnection 25 is not used as the local interconnection, but local interconnection 45 is formed to a thickness of approx. 300 Å at a pitch B of 0.39 µm (L/S=0.20/0.19 µm), which permits to reduce a distance A between the active regions down to 0.55 µm, to have an area of approx. 3.63 µm² in total.

FIGS. 8A~8L illustrate sections across a line VI—VI in FIG. 5 showing the steps of a method for fabricating an SRAM cell in accordance with a preferred embodiment of the present invention, and FIGS. 9A~9L illustrate sections across a line IV—IV in FIG. 5 showing the steps of a method for fabricating an SRAM cell in accordance with a preferred embodiment of the present invention.

Figure 8A:
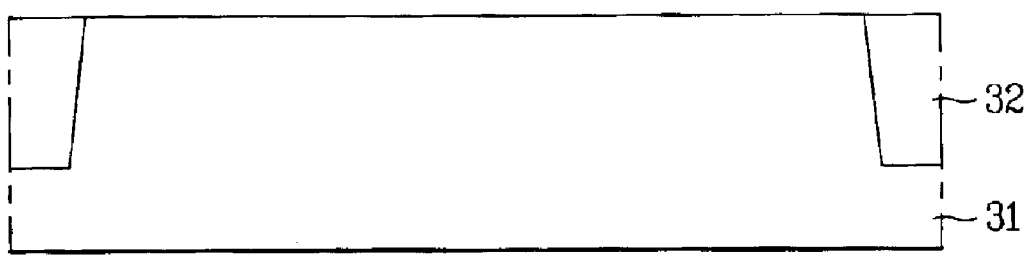
FIGS. 8A~8L illustrate sections across a line VI—VI in FIG. 5 showing the steps of a method for fabricating an SRAM cell in accordance with a preferred embodiment of the present invention.
Figure 9A:
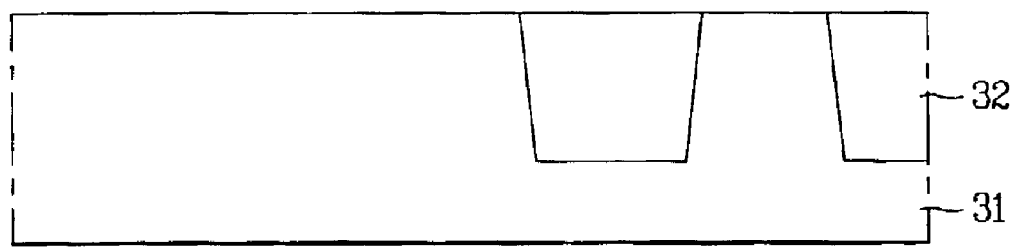
FIGS. 9A~9L illustrate sections across a line IV—IV in FIG. 5 showing the steps of a method for fabricating an SRAM cell in accordance with a preferred embodiment of the present invention.

Referring to FIGS. 8A and 9A, a device isolating film 32 is formed in a field region of a semiconductor substrate 31 having an active region and the field region defined thereon.

Though not shown, the device isolating film 32 is formed by the following method. A pad oxide film (approx. 140 Å) and a nitride film (approx. 1000 Å) are formed on the semiconductor substrate 31 in succession, and, after photoresist is coated on the nitride film, the photoresist is patterned by exposure and development, to define a field region and an active region.

Then, the nitride film and the pad oxide film are removed selectively by using the patterned photoresist as a mask, and the field region of the semiconductor substrate is removed selectively by using the nitride film as a mask, to form a trench to a depth of approx. 3500 Å.

In order to compensate the damage given to the semiconductor substrate 31 occurred in the trench formation, the semiconductor substrate 31 is oxidized, to form an oxide film on a surface of the trench (approx. 100 Å).

Then, a gap-fill HDP oxide film is formed on an entire surface of the semiconductor substrate 31 inclusive of the trench to a thickness of approx. 6000 Å, and annealed for 30 minutes at approx. 1000° C. temperature, and an entire surface of the semiconductor substrate 31 are subjected to CMP (Chemical Mechanical Polishing) taking the pad oxide film as an end point, to form a device isolating film 32 inside of the trench. Then, the semiconductor substrate 31 is washed, to remove the pad oxide film.

Figure 8B:
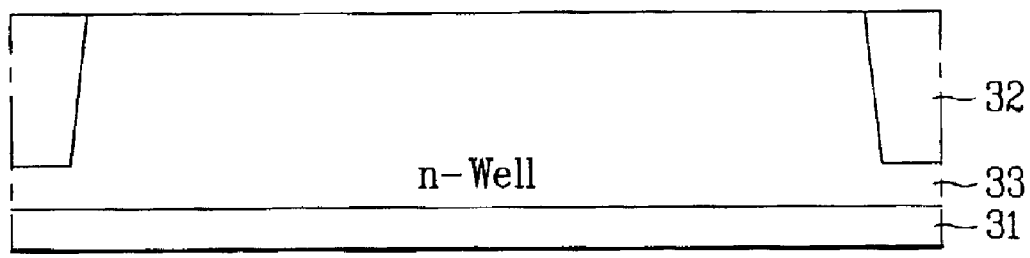
Figure 9B:
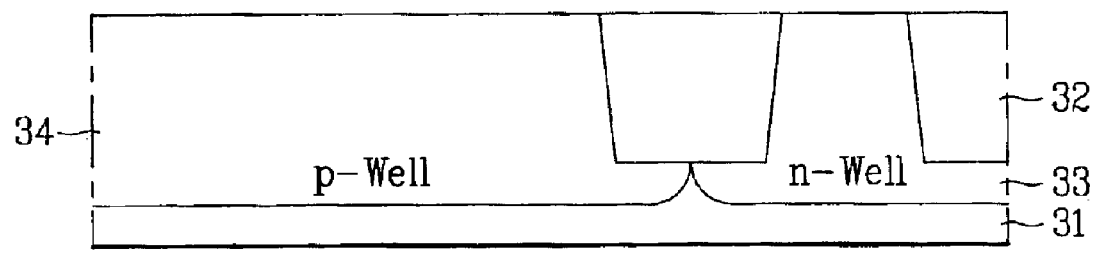

Referring to FIGS. 8B and 9B, n-type and p-type impurity ions are selectively injected into the semiconductor substrate 31, to form an n-well region 33 and a p-well region 34 in a surface of the semiconductor substrate 31, respectively. A method for forming the n-well region 33 and the p-well region 34 will be explained in detail.

A region of the semiconductor substrate 31 the n-well is to be formed therein is exposed by lithography, and phosphor P is injected to the exposed region for three times, i.e., at energies of 700 KeV, 250 KeV, and 140 KeV, successively by using a resist film (not shown) as a mask to form the n-well region 33.

Then, arsenic As is injected to the n-well region 33 at an energy of approx. 140 KeV for adjusting a threshold voltage of the n-well region 33.

Then, after the resist film is removed, a region the p-well is to be formed therein is exposed by lithography, and boron B is injected to the exposed region for three times, i.e., at energies of 350 KeV, 150 KeV, and 8 KeV, successively by using a resist film (not shown) as a mask, to form the p-well region 34. Then, boron B is injected to the p-well region 34 at an energy of approx. 20 KeV for adjusting a threshold voltage of the p-well region 34.

Figure 8C:
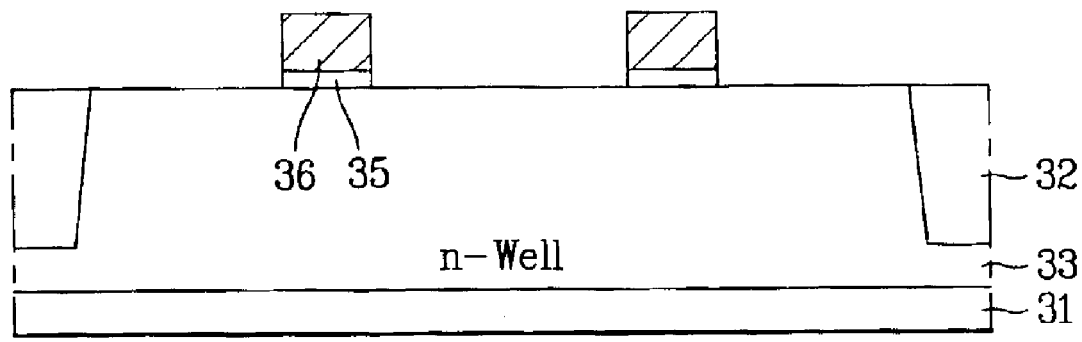
Figure 9C:
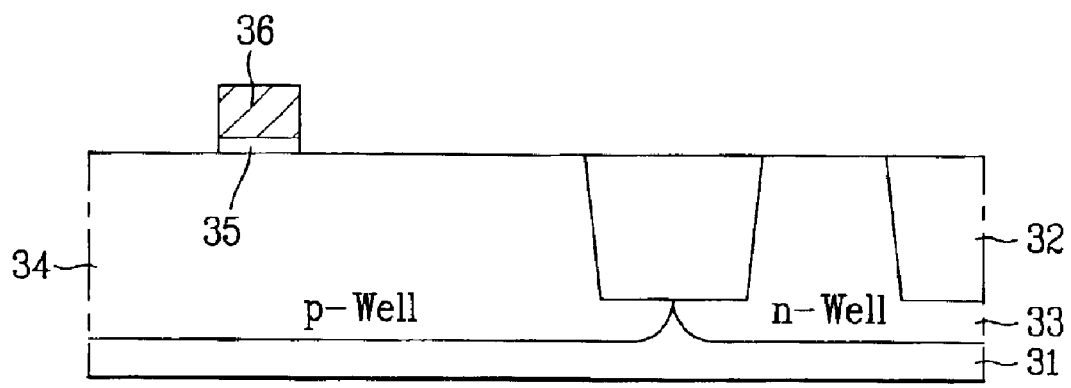

Referring to FIGS. 8C and 9C, the semiconductor substrate 31 is annealed, to activate the impurity ions injected into the n-well region 33 and the p-well region 34, and a gate insulating film 35 and a gate polysilicon film are formed on an entire surface of the semiconductor substrate 31 in succession.

The gate insulating film 35 may be formed as a dual gate insulating film in which a thickness of a region therein an NMOS transistor is to be formed therein and a thickness of a region a PMOS transistor is to be formed therein are different, with a thin region formed to a thickness of approx. 29 Å and a thick region formed to a thickness of approx. 59 Å. The polysilicon film has approx. 2500 Å.

Then, a photo- and etching process is carried out, to remove the polysilicon film, and the gate insulating film 35 selectively, to form a gate electrode 36.

Figure 8D:
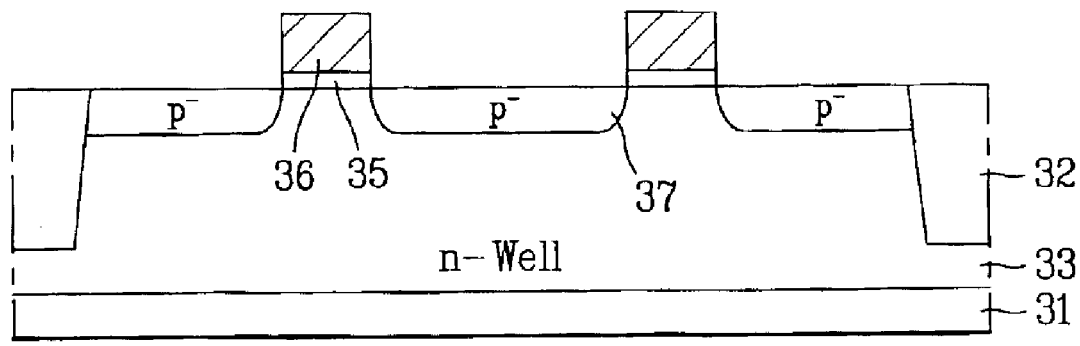
Figure 9D:
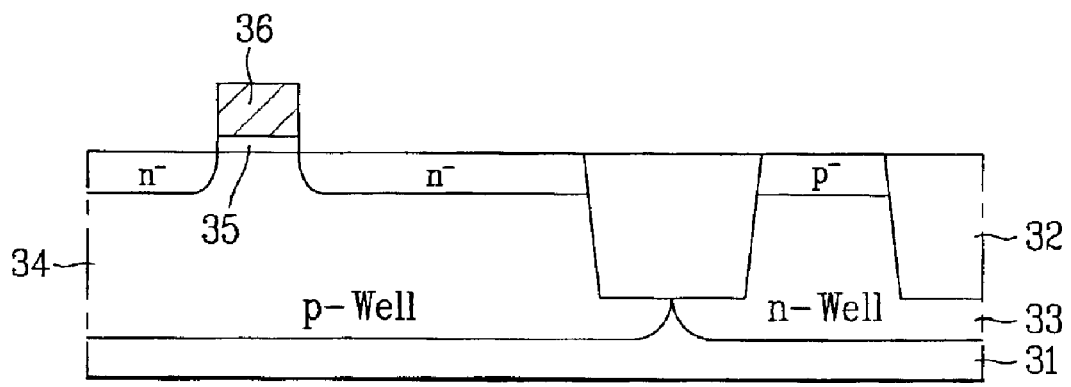

Referring to FIGS. 8D and 9D, n-type and p-type impurity ions are selectively injected into the semiconductor substrate 31 lightly by using the gate electrode 36 as a mask, to form LDD (Lightly Doped Drain) regions 37 in a surface of the semiconductor substrate 31 on both sides of the gate electrode 36.

Figure 8E:
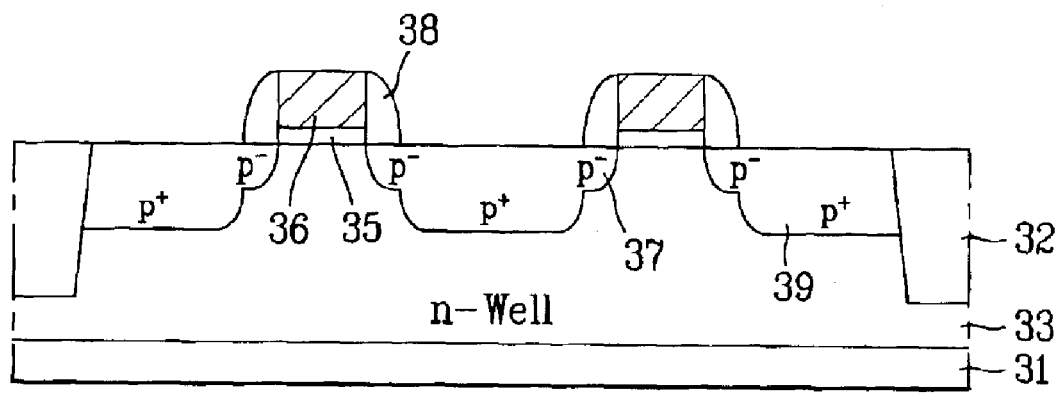
Figure 9E:
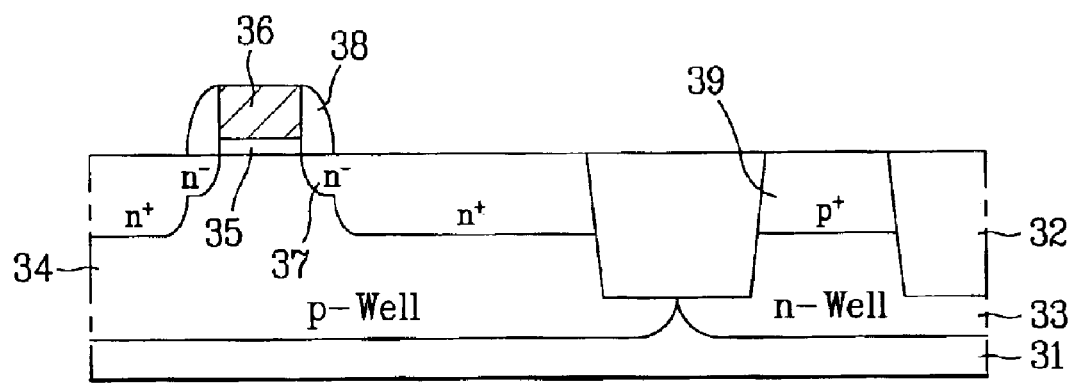

Referring to FIGS. 8E and 9E, an insulating film is formed on an entire surface inclusive of the gate electrode 36, and etched back, to form insulating sidewalls 38 at both sides of the gate electrode 36, and n-type and p-type impurity ions are heavily injected into an entire surface of the semiconductor substrate 31 selectively by using the insulating sidewalls 38 and the gate electrode 36 as a mask, to form source/drain regions 39 in the surface of the semiconductor substrate 31.

In the meantime, halo ions P or $BF_2$ may be injected into the semiconductor substrate 31, with an angle of the injection tilted at 30° with respect to the semiconductor substrate 31.

That is, if the halo ions that enhance a well concentration are injected into the source/drain regions 39 with a tilt, for solving the problems of difficulty in operation of the device and a poor performance of the device caused secondarily as a size of the logic device is reduced, such as HCE (Hot Carrier Effect), SCE (Short Channel Effect), and RSCE (Reverse SCE), since a doping concentration is increased locally only on an inside wall of a junction, a channel length can be shortened further while a concentration of the substrate is not increased.

Moreover, the punch-through can be suppressed with respect to the channel length, a junction breakdown voltage is increased, and cost can be saved since concentration is increased, not in the entire substrate, but locally in a required part.

Figure 8F:
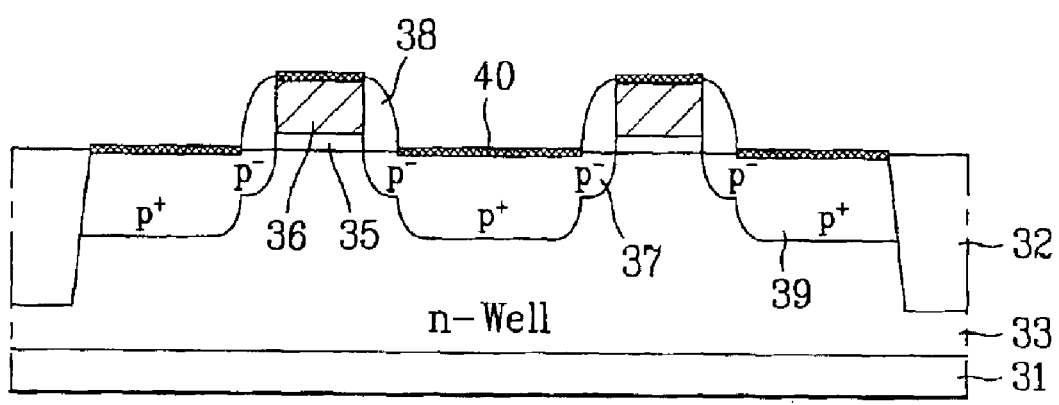
Figure 9F:
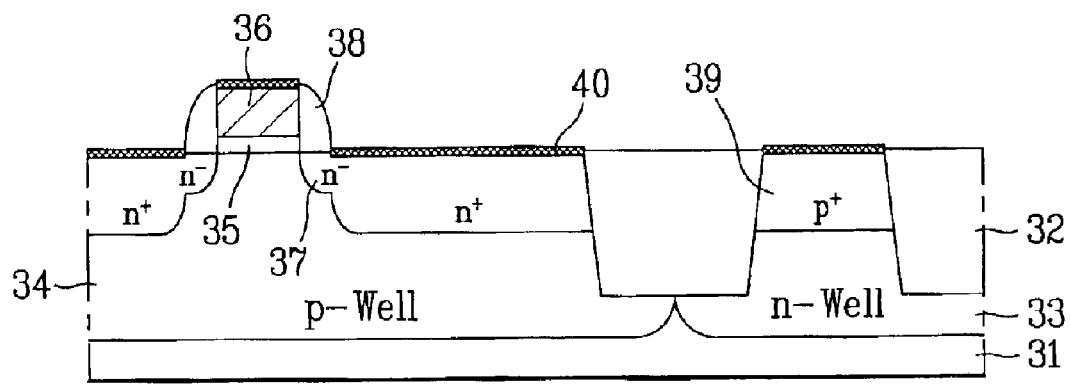

Referring to FIGS. 8F and 9F, a refractory metal film (for an example, Co/Ti and the like) is formed on an entire surface of the semiconductor substrate 31 inclusive of the gate electrode 36, and subjected to RTP (Rapid Thermal Processing), to form a metal silicide film 40 on the gate electrode 36 and the surface of the semiconductor substrate 31 having the source/drain regions 39 formed therein. In this instance, the Co/Ti are sputtered to 150/150 Å thickness.

The refractory metal film on the gate electrode 36 and the semiconductor substrate 31 made no reaction is removed by wet etching. In the RTP for forming the metal silicide 40, a first RTP is carried out at approx. 530° C. for 60 seconds, a second RTP is carried out at approx. 750° C. for 30 seconds, and the refractory metal film made no reaction is removed by wet etchant having $H_2O_2$ and $H_2SO_4$ mixed therein.

Figure 8G:
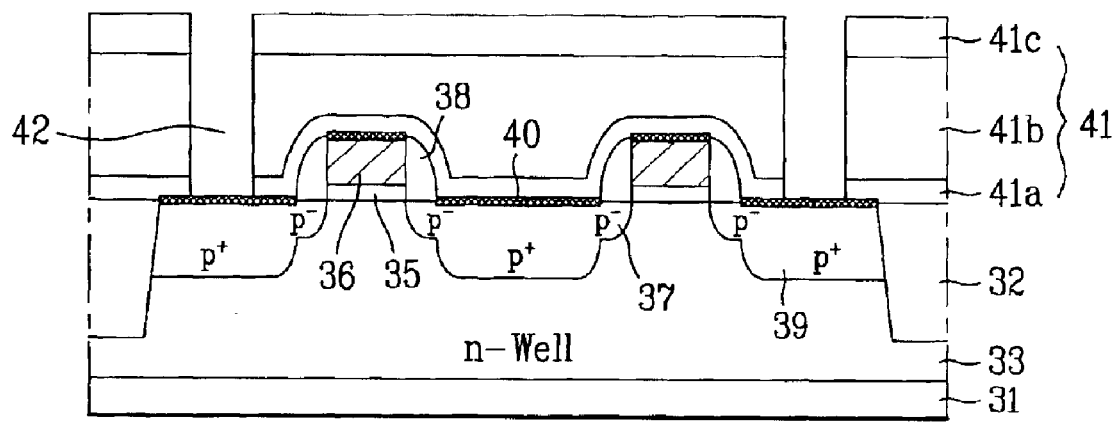
Figure 9G:
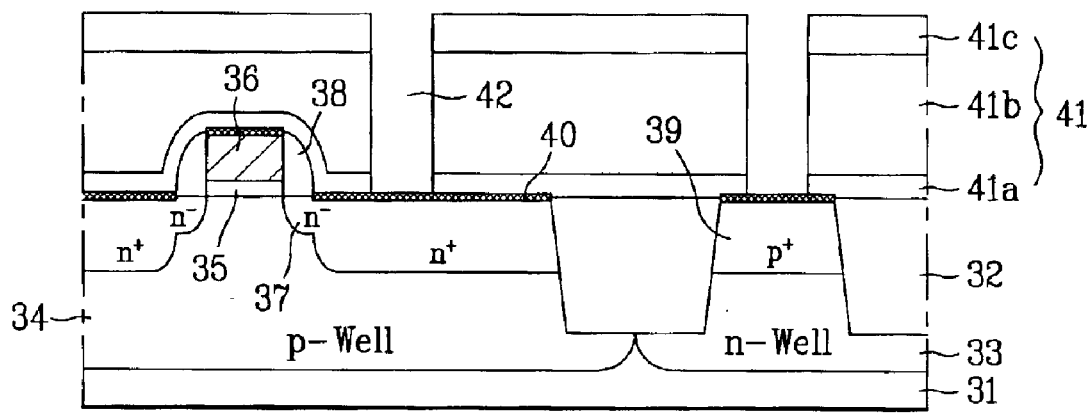

Referring to FIGS. 8G and 9G, a first interlayer insulating film 41 is formed on an entire surface of the semiconductor substrate 31 inclusive of the metal silicide, film 40. The first interlayer insulating film 41 includes an approx. 1000 Å thick nitride film 41a, an approx. 5500 Å thick BPSG film 41b, and an approx. 1000 Å thick PE-TEOS film 41c, stacked in succession.

In the meantime, the BPSG film 41a is formed to a thickness of approx. 8000 Å on the nitride film 41a, heat treated at a temperature of approx. 850° C. for 30 seconds, and subjected to CMP on an entire surface thereof down to approx. 2500 Å from a surface thereof, to form a flat surface.

Then, a photo and etching process is carried out to remove the first interlayer insulating film 41 selectively, to form a first contact hole 42 to expose parts of surfaces of the source/drain regions 39 and the gate electrode 36. The first contact hole 42 has a width of approx. 0.23 μm.

Figure 1:
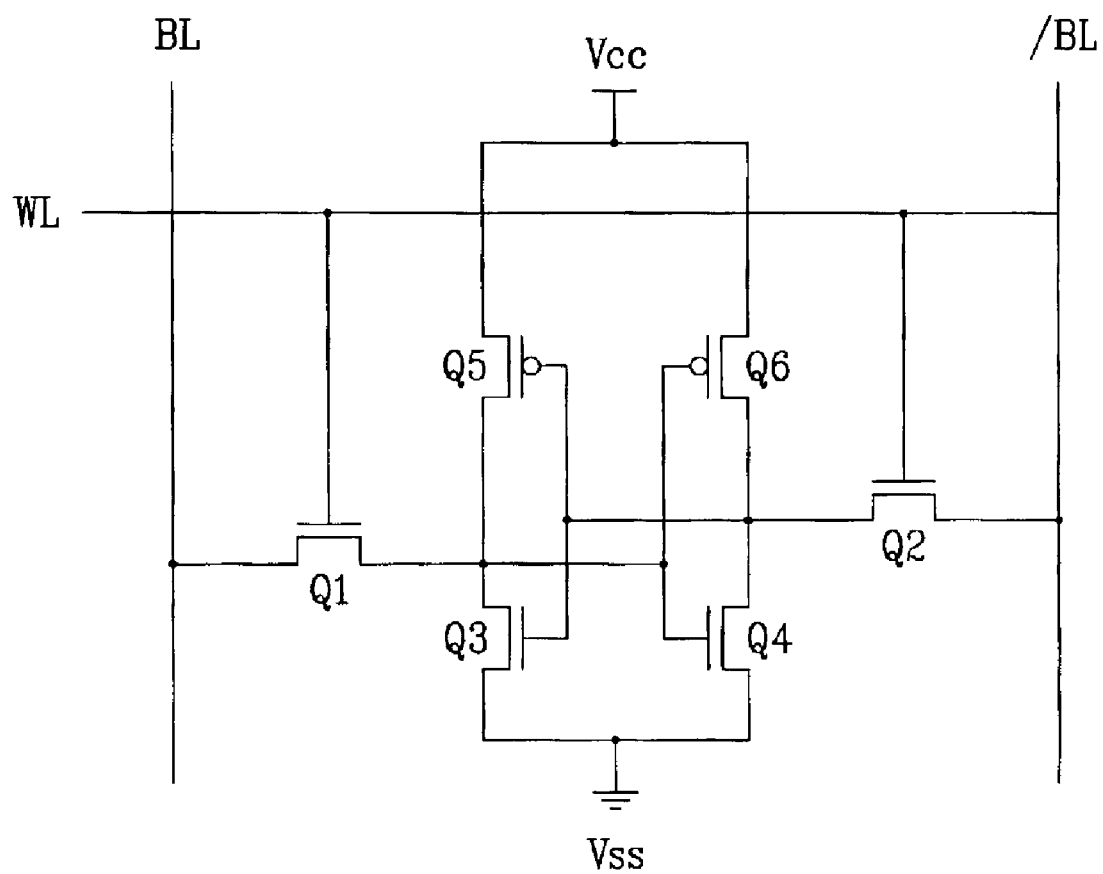
FIG. 1 illustrates an equivalent circuit of a related art COMS type SRAM cell.
Figure 2:
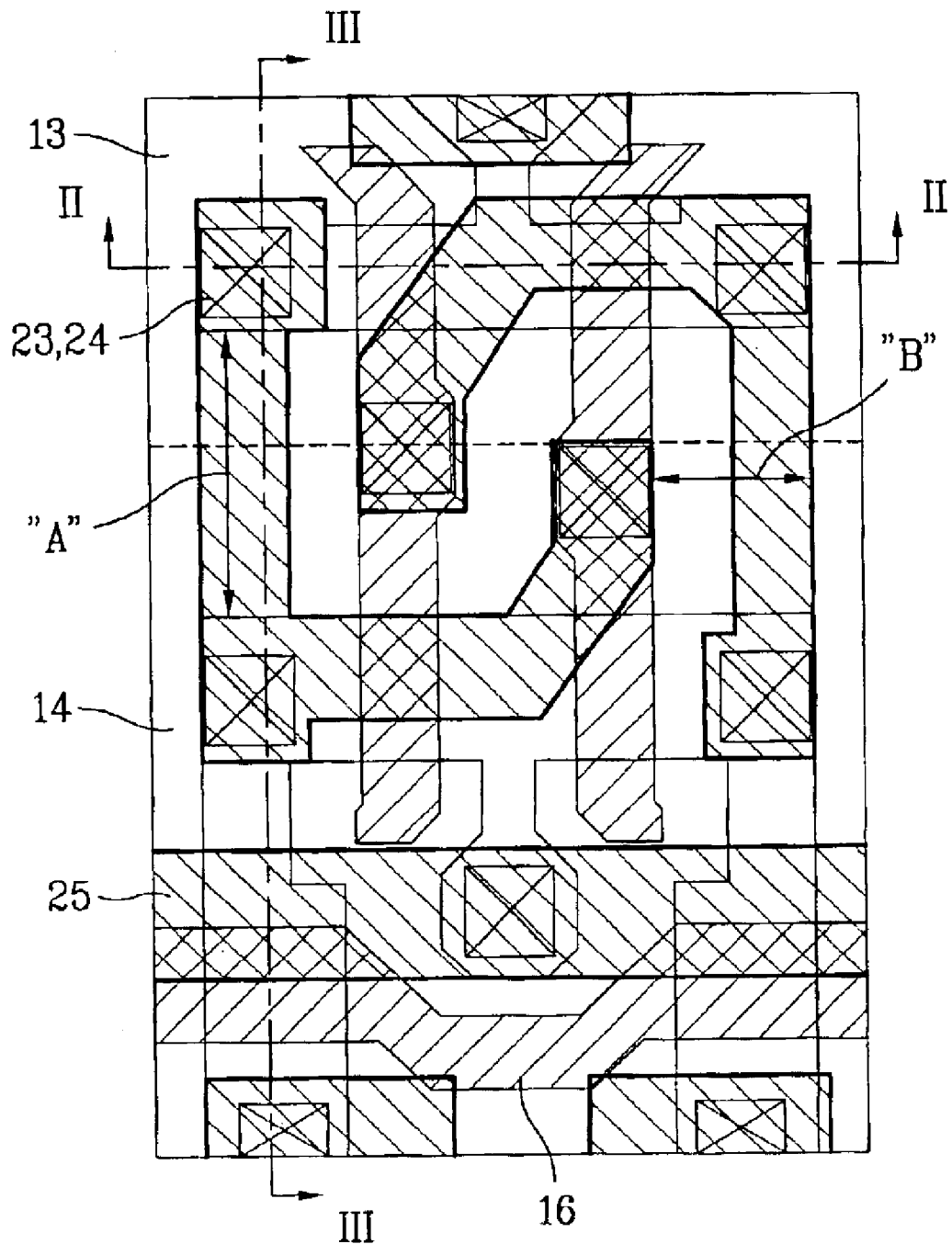
FIG. 2 illustrates a layout of a related art CMOS type SRAM cell.
Figure 3:
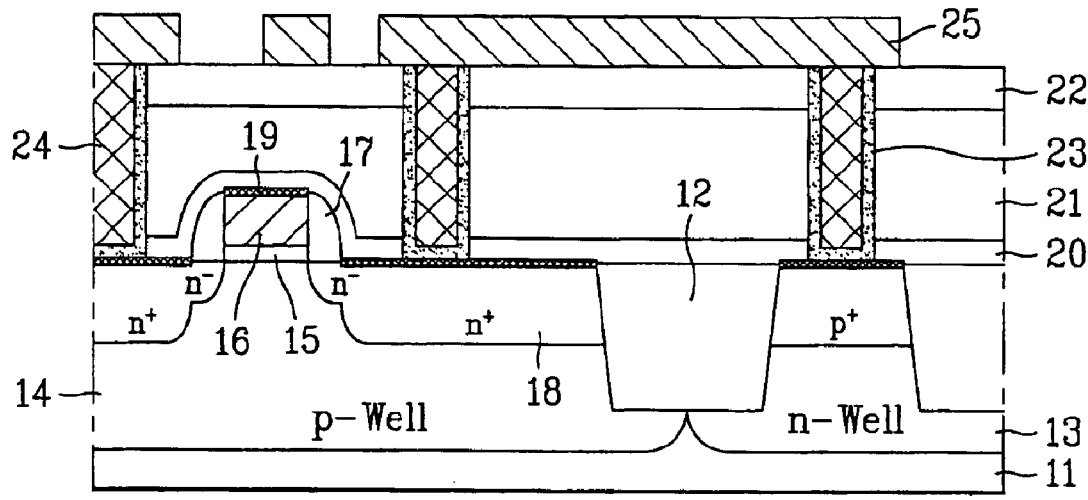
FIG. 3 illustrates a section of the SRAM across a line III—III in FIG. 2.
Figure 4:
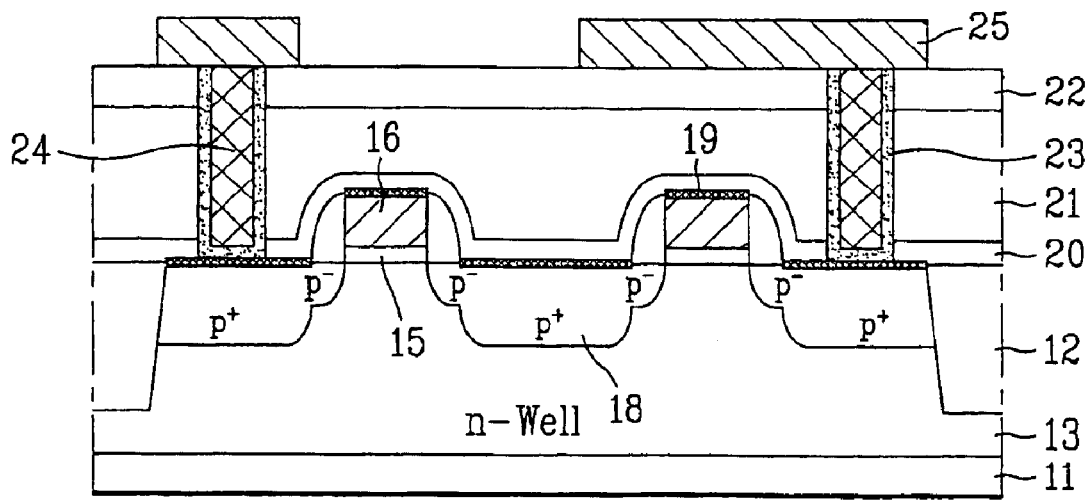
FIG. 4 illustrates a section of the SRAM across a line II—II in FIG. 2.

The first contact hole 42 is formed to expose parts of surfaces of the source/drain regions of the first load transistor Q5, the first drive transistor Q3, and the first access transistor Q1, and parts of surfaces of the gate electrodes of the second load transistor Q6 and the second drive transistor Q4, which are connected in parallel as shown in FIG. 1.

The first contact hole 42 is also formed to expose parts of surfaces of the source/drain regions of the second load transistor Q6, the second drive transistor Q4, and the second access transistor Q2, and parts of surfaces of the gate electrodes of the first load transistor Q5 and the first drive transistor Q3.

Figure 8H:
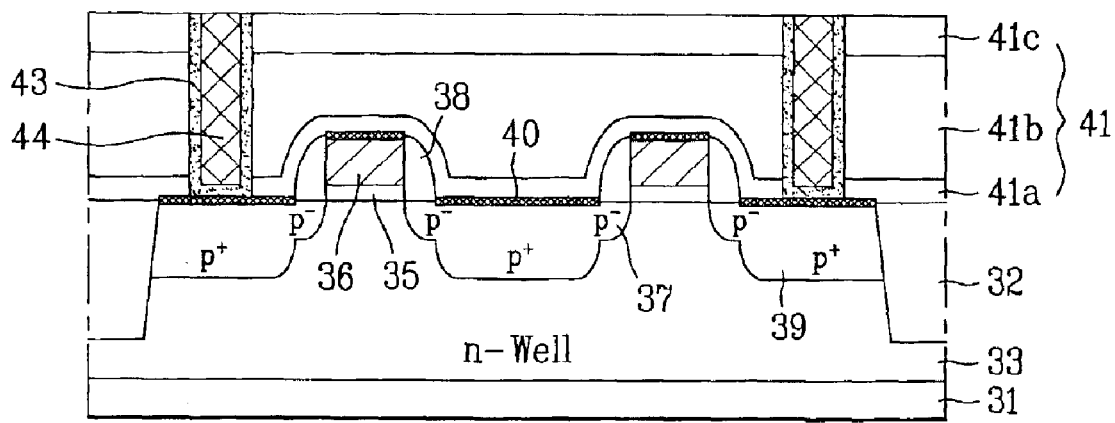
Figure 9H:
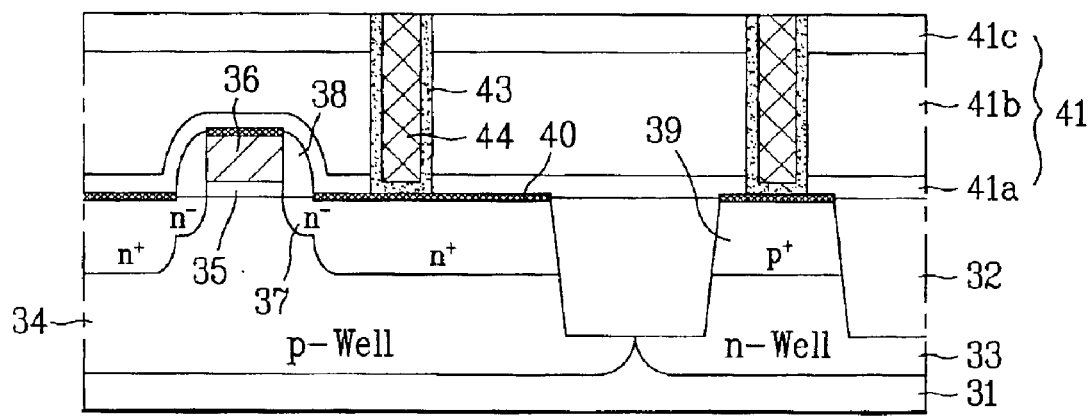

Referring to FIGS. 8H and 9H, a first barrier metal film 43 and a first tungsten film are formed in succession on an entire surface of the semiconductor substrate 31 inclusive of the first contact hole 42, and subjected to CMP to form a first tungsten plug 44 inside of the first contact hole 42. The first barrier metal film 43 has Ti/TiN films formed to 200/100 Å thickness, and the first tungsten film has a thickness of approx. 500 Å.

Figure 8I:
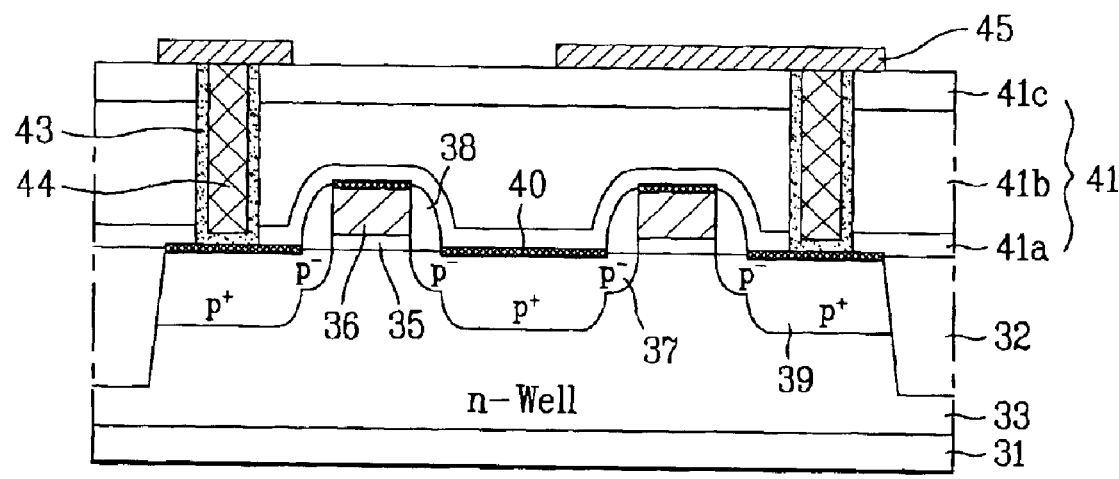
Figure 9I:
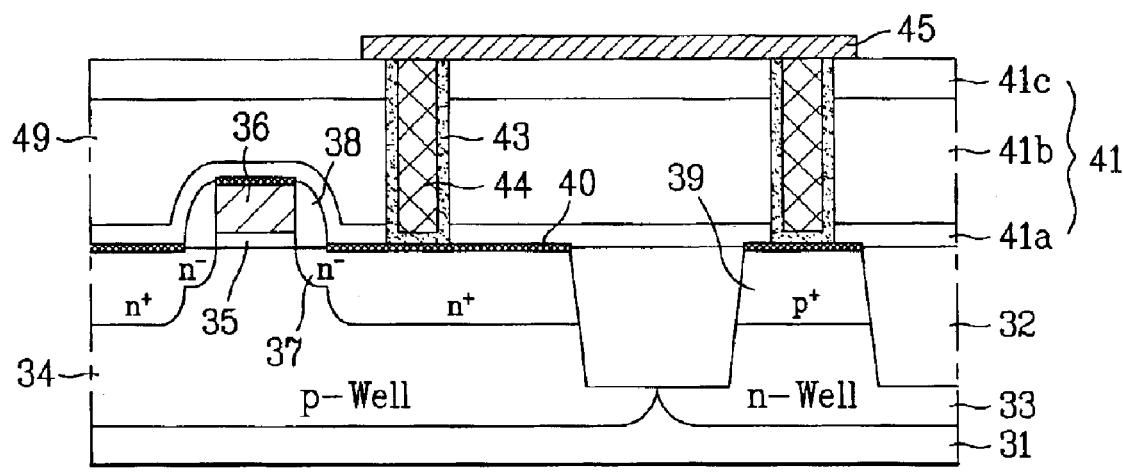

Referring to FIGS. 8I and 9I, a metal film of Ti/TiN films are formed on an entire surface of the semiconductor substrate 31 inclusive of the first tungsten plug 44, removed selectively by a photo and etching process, to form local interconnection 45 on the first tungsten plug 44 and the first interlayer insulating film 41 adjacent thereto. The local interconnection 45 has an L/S (Line/Space) of 0.20/0.19 μm.

Figure 8J:
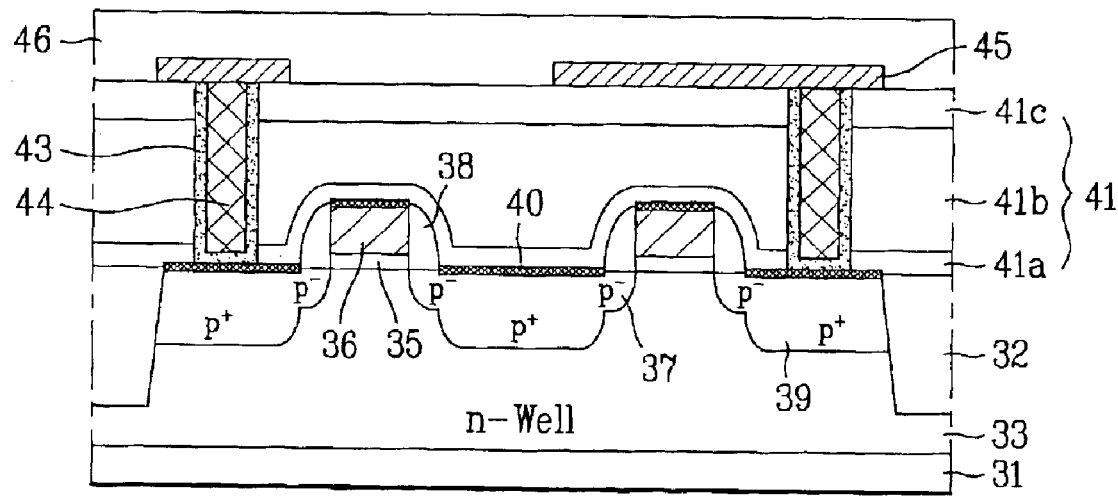
Figure 9J:
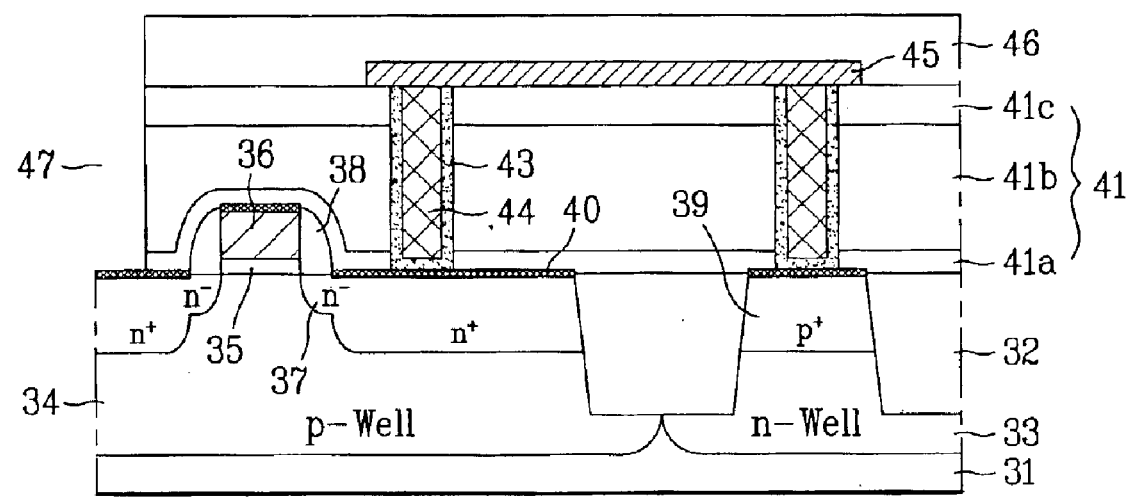

Referring to FIGS. 8J and 9J, a PE-TEOS film is formed as a second interlayer insulating film 46 to a thickness of approx. 4000 Å on an entire surface of the semiconductor substrate 31 inclusive of the local interconnection 45, and the second interlayer insulating film 46 and the first interlayer insulating film 41 are removed selectively, to expose parts of surfaces of the source/drain regions 39 having no first tungsten plug 44 formed thereon, to form a second contact hole 47.

The second contact hole 47 is formed to expose parts of the source/drain regions of the first, and second access transistors Q1 and Q2, and the first, and second drive transistors Q3 and Q4 shown in FIG. 1. The second contact hole 47 has a width of approx. 0.23 μm.

Figure 8K:
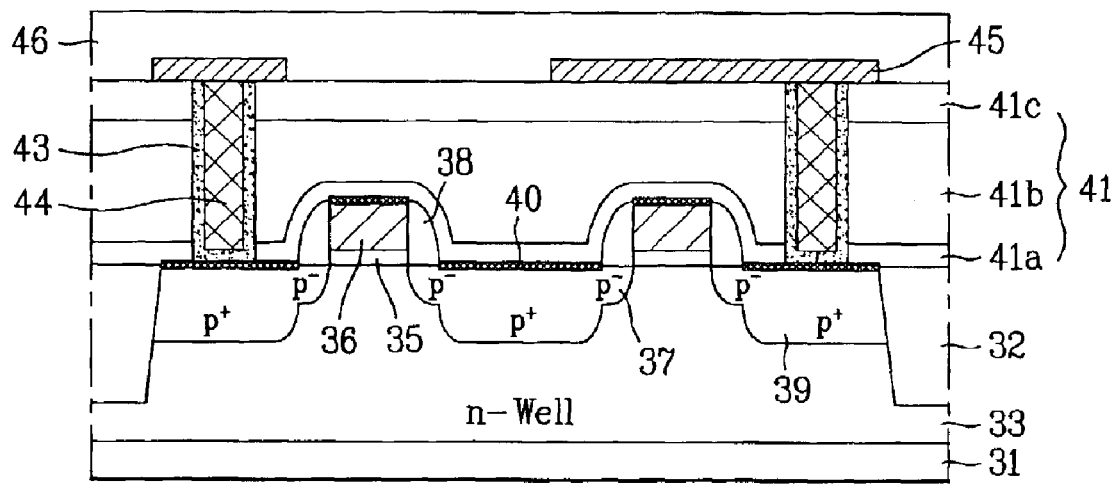
Figure 9K:
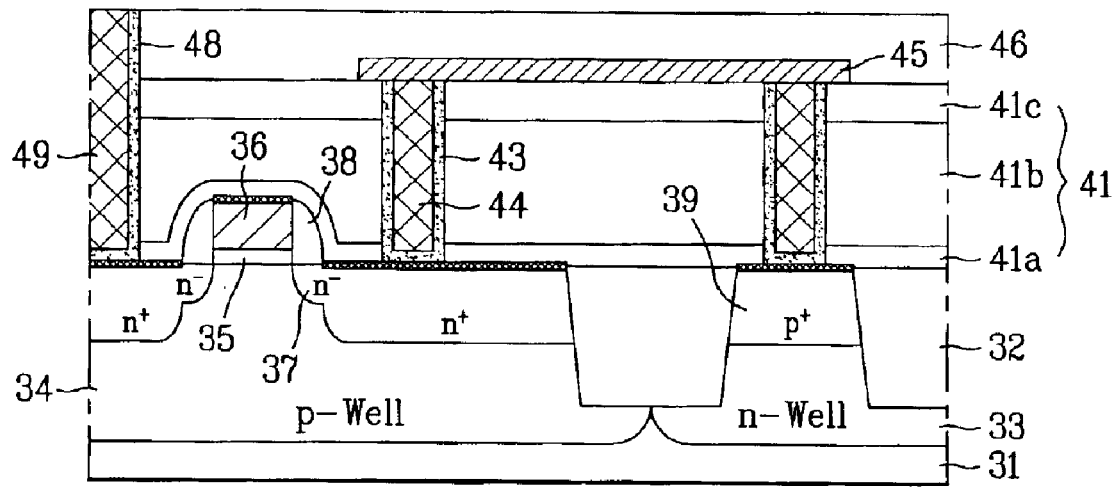

Referring to FIGS. 8K and 9K, a second barrier metal film 48 and a second tungsten film are formed in succession on an entire surface of the semiconductor substrate 31 inclusive of the second contact hole 47, and subjected to CMP to form a second tungsten plug 49 inside of the second contact hole 47. The second barrier metal film 48 has Ti/TiN films formed to 100/100 Å thickness, and the second tungsten film has a thickness of approx. 4000 Å.

Figure 8L:
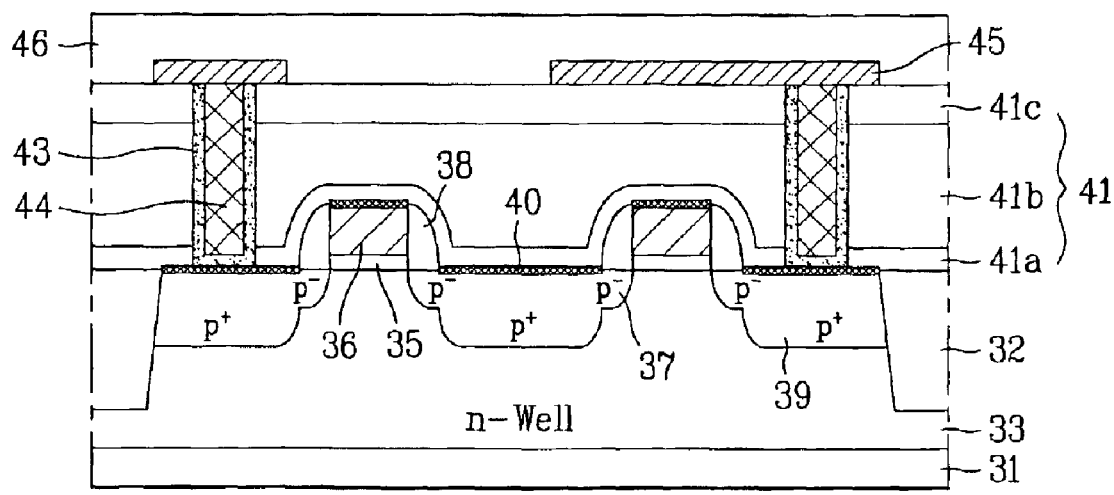
Figure 9L:
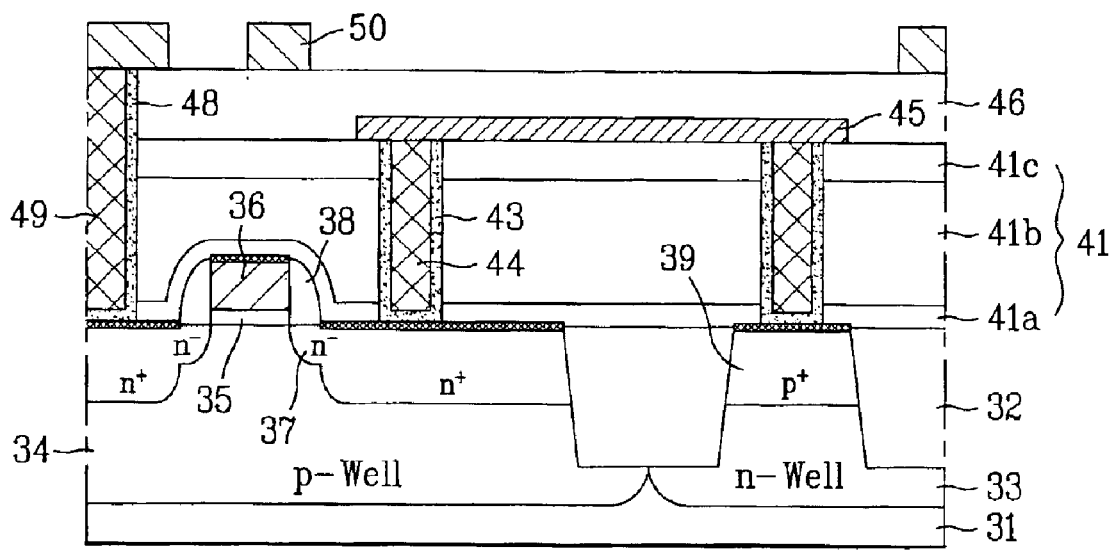

Referring to FIGS. 8L and 9L, a metal film is formed on an entire surface of the semiconductor substrate 31 inclusive of the second tungsten plug 49. The metal film has an approx. 100 Å thick first titanium film 50a, an approx. 4500 Å thick aluminum film on the first Ti film, an approx. 50 Å thick second titanium film on the aluminum film, and an approx. 600 Å thick first titanium nitride TiN film on the second titanium film.

Then, the metal film is selectively removed by a photo and etching process, to form metal interconnection 50. The metal interconnection 50 is used as a Vcc line, and a Vss line.

Figure 10:
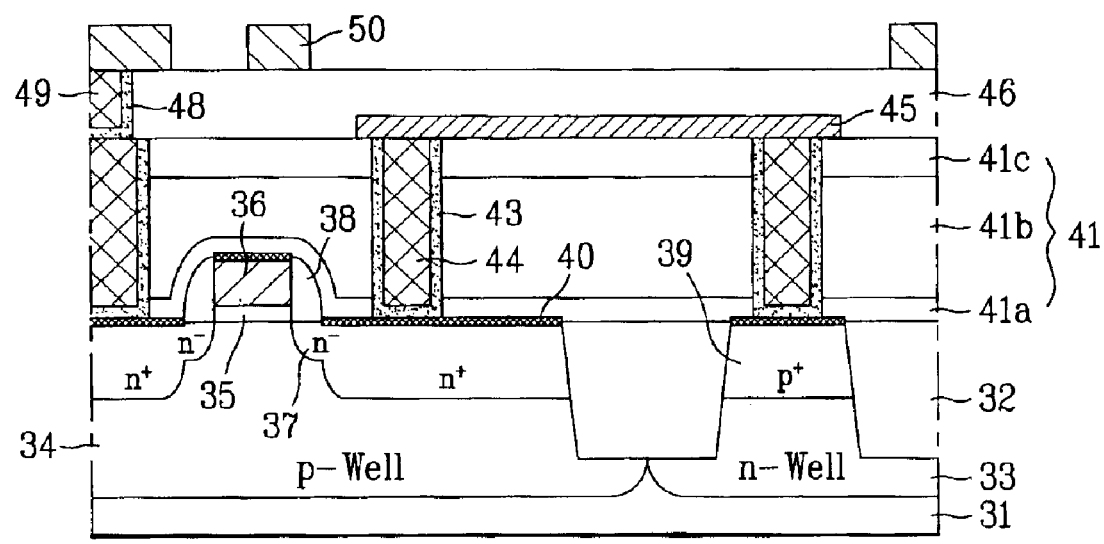
FIG. 10 illustrates a section showing a method for fabricating an SRAM cell in accordance with another preferred embodiment of the present invention.

FIG. 10 illustrates a section showing a method for fabricating an SRAM cell in accordance with another preferred embodiment of the present invention. The steps from FIGS. 8A and 9A to 8F and 9F are the same with the foregoing embodiment.

Referring to FIG. 10, in the formation of the first contact hole 42, the first contact hole 42 is formed to expose down to the source/drain regions 39 of the first, and second access transistors Q1 and Q2, and a first barrier metal film 43 and a first tungsten plug 44 are formed.

Then, a local interconnection 45 is formed, a second interlayer insulating film 46 is formed on an entire surface of the semiconductor substrate 31 inclusive of the local interconnection 45, and the second interlayer insulating film 46 is removed selectively to expose a surface of the first tungsten plug 44, to form a second contact hole 47.

Then, a second tungsten plug 49 is formed inside of the second contact hole 47 with a second barrier metal film 48 disposed inbetween, and a metal interconnection 50 is formed.

The following table 1 compares an SRAM cell of the present invention to the related art SRAM cell.

TABLE 1

|  | Related art (4.60 μm²) | The present invention (3.63 μm²) |
| --- | --- | --- |
| Cell size | 1.80 × 2.555 | 1.61 × 2.255 |
| Access transistor (Ta) | 0.35/0.28 | 0.255/0.235 |
| Drive transistor (Td) | 0.35/0.18 | 0.30/0.18 |
| Load Transistor (Tl) | 0.25/0.20 | 0.23/0.18 |
| β-ratio | 1.56 | 1.54 |
| Distance between wells | 0.70 μm | 0.55 μm (0.23/0.32) |

Referring to above table 1, the present invention permits to reduce a cell size within a range the reduction gives no influence to a cell stability (β-ratio=Ta/Ta).

As has been explained, the SRAM cell and method for fabricating the same of the present invention have the following advantage.

Even if the same 0.18 μm logic technology is applied, a 6T-SRAM with a 3.63 μm² smaller by 21% than the related art 6T-SRAM with a 4.60 μm² can be obtained.

It will be apparent to those skilled in the art that various modifications and variations can be made in the SRAM cell and method for fabricating the same of the present invention without departing from the spirit or scope of the invention. Thus, it is intended that the present invention cover the modifications and variations of this invention provided they come within the scope of the appended claims and their equivalents.

What is claimed is:
1. An SRAM cell having first and second access transistors, first and second drive transistors, and first and second load transistors on the same semiconductor substrate, comprising:
   a first local interconnection connected between first terminals of the first access transistor, the first load transistor, and the first drive transistor, and gates of the second load transistor, and the second drive transistor, electrically;
   a second local interconnection connected between first terminals of the second access transistor, the second load transistor, and the second drive transistor, and gates of the first load transistor, and the first drive transistor, electrically;
   a first interlayer insulating film formed on an entire surface having first contact holes exposing parts of second terminals of the first and second access transistors, the first and second load transistors, and first and second drive transistors;
   a first metal interconnection connected between second terminals of the first and second access transistors, first and second load transistors, and first and second drive transistors through the first contact holes, electrically;
   a second interlayer insulating film formed over an entire surface of the semiconductor substrate, the second interlayer insulating film having second contact holes exposing parts of second terminals of the first and second access transistors and first and second drive transistors; and
   a second metal interconnection connected to the second contact holes.

2. The SRAM cell as claimed in claim 1, wherein the first or second local interconnection is formed of a metal with a low resistance.

3. The SRAM cell as claimed in claim 1, wherein the first or second local interconnection is formed of TiN/Ti or copper.

4. The SRAM cell as claimed in claim 1, wherein the first or second local interconnection has a thickness of approx. 300 Å.

5. The SRAM cell as claimed in claim 1, wherein the first and second local interconnections are formed in symmetry.

6. The SRAM cell as claimed in claim 1, wherein the conductive plug is formed of tungsten.

7. The An SRAM cell as claimed in claim 1, wherein the metal interconnection is formed of aluminum or an alloy thereof.

8. The SRAM cell as claimed in claim 1, wherein the second interlayer insulating film is formed of PE-TEOS.

9. The SRAM cell as claimed in claim 1, wherein the interlayer insulating film has a thickness of 4000 Å.

10. The SRAM cell as claimed in claim 1, wherein the metal interconnection is a metal film having a stack of Ti/Al/Ti/TiN films.

11. The SRAM cell as claimed in claim 1, wherein the first, and second local interconnections have line/space of 0.20/0.19 μm.

12. The SRAM cell as claimed in claim 1, wherein the contact hole has a width of 0.23 μm.

13. The SRAM cell as claimed in claim 1, further comprising a barrier metal film formed on a surface of the contact hole.

14. The SRAM cell as claimed in claim 13, wherein the barrier metal film includes a stack of Ti/TiN films.

15. An SRAM cell having first and second access transistors, first and second drive transistors, and first and second load transistors on the same semiconductor substrate, comprising:
   a first interlayer insulating film formed over an entire surface thereof having first contact holes to expose parts of a first terminal of the second access transistor, the second load transistor, and the second drive transistor, parts of gates of the first load transistor and the first drive transistor, and parts of second terminals of the first and second access transistors, first and second load transistors, and first and second drive transistors;
   a first conductive plug inside of the first contact hole with a first barrier metal film disposed inbetween;
   a local interconnection on the first conductive plug and the first interlayer insulating film adjacent to the first conductive plug;
   a second interlayer insulating film formed over an entire surface having second contact holes to expose parts of second terminals of the first and second access transistors, first and second load transistors, and first and second drive transistors;
   a second conductive plug formed inside of the second contact hole with a barrier metal film disposed inbetween; and
   a metal interconnection on the second conductive plugs and the second interlayer insulating film adjacent to the second conductive plug,
   wherein the local interconnection has a thickness of approx. 300 Å.

16. The SRAM cell as claimed in claim 15, wherein the second interlayer insulating film is formed of PE-TEOS.

17. The SRAM cell as claimed in claim 15, wherein the local interconnections have line/space of 0.20/0.19 μm.

18. The SRAM cell as claimed in claim 15, wherein the first, or second contact hole has a width of 0.23 μm.

19. An SRAM cell having first and second access transistors, first and second drive transistors, and first and second load transistors on the same semiconductor substrate, comprising:
   a first local interconnection connected between first terminals of the first access transistor, the first load transistor, and the first drive transistor, and gates of the second load transistor, and the second drive transistor, electrically;
   a second local interconnection connected between first terminals of the second access transistor, the second load transistor, and the second drive transistor, and gates of the first load transistor, and the first drive transistor, electrically;
   an interlayer insulating film formed over an entire surface having contact holes exposing parts of second terminals of the first and second access transistors, the first and second load transistors, and first and second drive transistors; and
   a metal interconnection connected between second terminals of the first and second access transistors, first and second load transistors, and first and second drive transistors through the contact holes, electrically,
   wherein the first or second interconnection has a thickness of approximately 300 Å.

20. The SRAM cell as claimed in claim 19, wherein the first and second local interconnections have line/space of 0.20/0.19 μm.

21. The SRAM cell as claimed in claim 19, wherein the contact hole has a width of 0.23 μm.

* * * * *